United States Patent [19]

Winkle

[11] Patent Number: 5,066,374

[45] Date of Patent: Nov. 19, 1991

[54] ELIMINATION OF FILM DEFECTS DUE TO HYDROGEN EVOLUTION DURING CATHODIC ELECTRODEPOSITION

[75] Inventor: Mark R. Winkle, Lansdale, Pa.

[73] Assignee: Rohm and Haas Company, Philadelphia, Pa.

[21] Appl. No.: 585,428

[22] Filed: Sep. 20, 1990

[51] Int. Cl.$^5$ ............................................. C25D 13/10
[52] U.S. Cl. ............................. 204/181.4; 204/180.6; 204/181.6
[58] Field of Search .......................... 204/180.1–180.9, 204/181.4, 72, 73 R, 74, 181.7

[56] References Cited

U.S. PATENT DOCUMENTS

| | | | |
|---|---|---|---|
| 4,108,817 | 8/1978 | Lochel | 204/181.4 |
| 4,592,816 | 6/1986 | Emmons et al. | 204/180.6 |
| 4,877,818 | 10/1989 | Emmons et al. | 522/26 |

FOREIGN PATENT DOCUMENTS 56-69836 7/1981 Japan .

Primary Examiner—John F. Niebling
Assistant Examiner—Kishor Mayekar
Attorney, Agent, or Firm—James G. Vouros

[57] ABSTRACT

This invention is directed to a method for eliminating or reducing pinhole defects in cataphoretically deposited films without interfering with the electrolysis of water needed for electrodeposition. This method comprises decreasing the evolution of hydrogen gas at the cathode by adding a compound to the emulsion. This compound is reduced by the hydrogen produced at the cathode during the electrodeposition. The hydrogen reacts with the this non-gaseous compound rather than becoming hydrogen gas and forming bubbles which lead to pinhole defects.

6 Claims, No Drawings

ELIMINATION OF FILM DEFECTS DUE TO HYDROGEN EVOLUTION DURING CATHODIC ELECTRODEPOSITION

FIELD OF THE INVENTION

This invention is related to my U.S. Pat. No. 4,592,816, entitled Electrophoretic Deposition Process, and my U.S. Pat. No. 4,877,818, entitled Electrophoretically Depositable Photosensitive Polymer Composition.

This invention relates to a method of reducing or eliminating defects in polymeric films which are cataphoretically deposited onto conductive surfaces from an aqueous medium. More particularly, this invention relates to the use of certain hydrogen scavenger compounds which react with hydrogen gas that evolves at the cathode during electrodeposition from an aqueous medium.

BACKGROUND OF THE INVENTION

Electrodeposition of polymeric films from aqueous dispersions onto conductive surfaces is an attractive method for producing adherent films of uniform thickness. My U.S. Pat. No. 4,592,816 describes such a process for electrodepositing a photosensitive film which can be used as a aqueously developable, negative acting photoresist to transfer an image pattern onto a conductive surface such as a printed circuit board. The photosensitive composition used in my prior invention is an aqueous dispersion containing at least one polymer free of ethylenic unsaturation and having charged carrier groups, a photoinitiator and an unsaturated crosslinking monomer. The electrodeposited photosensitive film can be selectively exposed to a source of actinic radiation to create a crosslinked polymer image on the surface corresponding to the image pattern described on a photomask, while the unexposed portion can be removed from the surface using an aqueous developer solution. Any defect, however small, such as for example a pinhole, in the imaged film can leave the conductive surface exposed and result in an incomplete circuit.

Electrodeposition of polymers (electrophoretic coating) generally produces good quality films of uniform thickness. The self limiting nature of the process assures that all conductive surfaces are coated with an even thickness of the film. In principal, this process produces films free of pinholes. A pinhole in the film leaves the conductive surface of the substrate exposed, allowing the passage of current which would initiate the deposition of material in the pinhole. In practice, however, pinholes are observed in films applied by electrodeposition.

The coalescence of the emulsion particles into a film on the conductive surface depends on hydroxide ions produced at the cathode surface by the electrolysis of water. Hydrogen evolution is also a product of the electrolysis of water occurring during the electrodeposition and can lead to pinholes in the film deposited by cationic electrodeposition (cataphoretic coating).

The emulsion particles in most emulsions for cationic electrodeposition are stabilized by the presence of protonated amines on the surface of the particle. These form a hydrophilic shell around the hydrophobic interior of the stabilized particles in the aqueous matrix. The low pH of the bath keeps the amines protonated. During the electrodeposition, these charged particles migrate to the surface of the cathode under the influence of the potential applied across the electrodes. The pH at the cathode surface is much higher than the pH of the bulk of the emulsion due to the hydroxide ions produced during the electrolysis of the water. The protonated amines are deprotonated and the particle becomes hydrophobic. The emulsion particle is no longer stable in the aqueous medium because the hydrophilic shell of protonated amines has been destroyed. These deprotonated particles coalesce to form a film on the surface of the cathode.

The hydrogen, a product of the electrolysis of water, is necessary to implement the electrodeposition of the polymer. Eliminating the electrolysis of water would eliminate the hydrogen bubbles which produce pinholes, but the polymer film would not be electrodeposited since no hydroxide would be produced.

The hydrogen gas produced at the cathode can produce defects at various stages of the film formation. A hydrogen bubble formed on the surface of the substrate before the film has begun to deposit displaces the emulsion and prevents deposition in the area covered by the bubble. This results in a pinhole in the final film. A bubble can also form under the film after the film deposition has started. This bubble can grow, lifting the film from the surface of the substrate (cathode), forming a void under the thin layer film. No further deposition takes place since the bubble has excluded the emulsion and acts as an electrical insulator. This can occur before the film has reached its full thickness. The final film suffers voids covered with only a thin film of the polymeric material. These defects are unsightly and reduce the protection provided electrodeposited coating. The thin film over the void can also break on drying or baking to produce a pinhole.

The problem of pinholes is usually addressed by formulating compositions used to form a film which lead to few pinholes. However, few principles are known for the formulation of compositions producing few pinholes, and trial and error is usually used. The deposition conditions can also be optimized to produce the fewest pinholes. Pinholes in the film can be eliminated by baking the film. This softens the film so that it flows into the pinholes.

Japanese Patent 56069836-A describes the use of unsaturated compounds to absorb hydrogen gas during the electrodeposition of a glass dispersion onto a silicon surface to prevent pinholes in coating. This Japanese patent describes only the use of unsaturated compounds with electron withdrawing groups attached to the alpha position, such as acrylic acid and its esters, methacrylic acid and its esters, acrylonitrile, and styrene. The electrodeposition was carried out at high voltages (450 V). No example of depositing an organic film is given. The compounds described in this Japanese patent showed little or no utility for eliminating hydrogen evolution in the deposition of organic films from emulsions.

The reduction of compounds with hydrogen in the presence of a catalyst, known as catalytic hydrogenation, is well known and widely used. Catalytic hydrogenation is usually carried out by sealing hydrogen gas, the compound to be reduced and the catalyst in a vessel. The reaction mixture is agitated until the reaction is complete. Heat and pressure are frequently needed to complete the reaction in a reasonable amount of time. Noble metals (and compounds of noble metals) are generally the most effective catalysts although base metals are also used. The catalyst is necessary because the addition of the hydrogen to the compound does not take place directly. The hydrogen is first adsorbed onto the surface of the catalyst, and it is this adsorbed hydrogen that reduces the compound.

A similar technique for reducing compounds that has received much less attention is electrocatalytic hydrogenation (electrohydrogenation). Usually, the catalyst in this technique also acts as a cathode in an electrolytic cell. In some cases the catalyst is coated onto a cathode which is not catalytic. The hydrogen produced by the electrolysis is adsorbed onto the catalyst surface. Reducible compounds dissolved in the electrolyte are then reduced by the hydrogen adsorbed on the surface of the cathode/catalyst. The objective of electrocatalytic hydrogenation is to prepare the reduced product. The process of the present invention uses a similar technique but the objective is to consume the hydrogen before it forms gas bubbles which cause defects in the film during electrodeposition.

It is the object of the present invention to eliminate or reduce the pinhole defects in cataphoretically deposited films. It is a further object of the present invention to incorporate a compound into a cataphoretically deposited photosensitive composition to decrease hydrogen gas evolution without interfering with the cataphoretically deposited films.

SUMMARY OF THE INVENTION

I have discovered a method for eliminating or reducing pinhole defects in cataphoretically deposited films without interfering with the electrolysis of water needed for electrodeposition. This method comprises decreasing the evolution of hydrogen gas at the cathode by adding a compound to the emulsion. This compound is reduced by the hydrogen produced at the cathode during the electrodeposition. The hydrogen reacts with the this non-gaseous compound rather than becoming hydrogen gas and forming bubbles which lead to pinhole defects.

DETAILED DESCRIPTION OF THE INVENTION

Decreasing hydrogen evolution at the cathode during cationic electrodeposition is implemented by adding a "hydrogen scavenger" to the electrodeposition emulsion before the electrodeposition is carried out. As used herein, "hydrogen scavenger" is any compound that reacts with hydrogen to prevent the formation of bubbles of gaseous hydrogen.

Although the mechanism of the process set forth herein is not fully understood, it is believed the hydrogen scavenger reacts with the hydrogen in the following manner. The electrolysis produces hydrogen that is adsorbed (or becomes adsorbed) on the surface of the metal cathode. This adsorbed hydrogen reacts with the hydrogen scavenger to produce a reduced form of the hydrogen scavenger. This reduced hydrogen scavenger can be incorporated into the film or dissolved in the aqueous phase. It is also possible the reduced form dissolved in the aqueous phase can find its way to the anode and reoxidize to the original hydrogen scavenger. In this case, no net consumption of the hydrogen scavenger takes place. The theory of this invention is presented here as a possible explanation of the results obtained and in no way is intended to limit the scope of this invention.

Electrohydrogenation usually requires carefully prepared cathodes of expensive materials (e.g. platinum and rhodium) and high pressures are frequently required to produce the proper efficiency. In order for this technique to be practical in the present process, the hydrogen scavenger must be effective under the conditions of the deposition cell (atmospheric pressure and temperatures below 50° C. are normally used). The metal of the article to be coated must act as an effective catalyst since special preparation would be impractical.

Two methods were used to evaluate candidate compounds to determine which were the most effective in decreasing the hydrogen gas production. In the first method, the evolution of hydrogen at the cathode in an aqueous electrolyte is compared to the evolution after the compound being evaluated has been added to the electrolyte. A decrease in the hydrogen evolution after the compound has been added indicates that it is capable of decreasing hydrogen evolution. The second test method is a functional test. A film is deposited by electrodeposition under conditions which produce pinholes due to hydrogen evolution. The compound being evaluated as a hydrogen scavenger is then added to the emulsion. A second electrodeposition is then carried out. If this film has fewer defects than the film deposited before the compound was added then the compound under question is an effective hydrogen scavenger.

A number of compounds that work well as hydrogen scavengers have been identified. The more preferred compounds effective as hydrogen scavengers are organic nitro compounds and furans. Nitro compounds are known to be readily reduced by catalytic hydrogenation. Organic compounds that are soluble in the aqueous phase of the electrodeposition emulsion are preferred.

Preferred hydrogen scavengers are compounds that are readily reduced under the conditions (temperature, pressure, pH, etc.) of the electrodeposition and are not detrimental to the deposition process. The by-products of the deposition should also not interfere with the deposition. They should reduce the amount of hydrogen evolution at the cathode as evaluated by the electrolysis of an aqueous solution and should be effective in a functional test.

Compounds effective as hydrogen scavengers are nitro compounds of the following structure:

Structure I wherein $R_1$ is hydrogen, or a $C_1$-$C_{10}$ alkyl group;

$R_2$ is hydrogen, a $C_1$-$C_{10}$ alkyl group, an aromatic hydrocarbon group or hydroxyl substituted $C_1$-$C_{10}$ alkyl group; and $R_3$ is hydrogen, a $C_1$-$C_{10}$ alkyl group, an aromatic hydrocarbon group, or a hydroxyl substituted $C_1$-$C_{10}$ alkyl group; and when $R_1$ and $R_2$ are both hydrogen, $R_3$ is hydrogen, a $C_1$-$C_{10}$ alkyl group, an aromatic hydrocarbon group, or a hydroxyl substituted $C_1$-$C_{10}$ alkyl group;

when $R_1$ is hydrogen and $R_2$ is a $C_1$-$C_{10}$ alkyl group or an aromatic hydrocarbon group, $R_3$ is a $C_1$-$C_{10}$ alkyl group, an aromatic hydrocarbon group, or a hydroxyl substituted $C_2$-$C_{10}$ alkyl group;

when $R_1$ is hydrogen and $R_2$ is a hydroxyl substituted $C_1-C_{10}$ alkyl group, $R_3$ is a hydroxyl substituted $C_1-C_{10}$ alkyl group;

and when $R_1$ is a $C_1-C_{10}$ alkyl group and $R_2$ is a $C_1-C_{10}$ alkyl group or a hydroxyl substituted $C_1-C_{10}$ alkyl group, $R_3$ is a hydroxyl substituted $C_1-C_{10}$ alkyl group.

Also useful as hydrogen scavengers are nitrobenzene, nitrobenzene substituted with hydroxyl groups, $C_1-C_{10}$ alkyl groups, or hydroxyl substituted $C_1-C_{10}$ alkyl groups; furan and furan substituted with hydroxyl groups, $C_1-C_{10}$ alkyl groups, or hydroxyl substituted $C_1-C_{10}$ alkyl groups.

The more preferred compounds are the compounds of structure I where $R_1$ and $R_2$ are hydrogen, and $R_3$ is hydrogen, a $C_1-C_{10}$ alkyl group or an hydroxyl substituted $C_1-C_{10}$ alkyl group;

or where $R_1$ is hydrogen, $R_2$ is a $C_1-C_{10}$ alkyl group, and $R_3$ is a $C_1-C_{10}$ alkyl group, or an hydroxyl substituted $C_2-C_{10}$ alkyl group;

or where $R_1$ is hydrogen, and $R_2$ and $R_3$ are hydroxyl substituted $C_1-C_{10}$ alkyl groups;

or where $R_1$ is a $C_1-C_{10}$ alkyl group, and $R_2$ and $R_3$ are hydroxyl substituted $C_1-C_{10}$ alkyl groups; and nitrobenzene, and nitrobenzene substituted with hydroxyl groups, $C_1-C_{10}$ alkyl groups, or hydroxyl substituted $C_1-C_{10}$ alkyl groups.

The most preferred hydrogen scavengers are nitromethane, nitroethane, 1-nitropropane, 2-nitropropane, 2-nitroethanol, 2-nitro-1-propanol, 3-nitro-2-butanol, 2-methyl-2-nitro-1-propanol, and 4-nitrobenzyl alcohol.

The hydrogen scavenger is added to the emulsion or aqueous solution in a concentration of from about 0.05% to 10% and more preferably from about 3% to 5% by weight based on the total weight of the emulsion or solution.

The polymeric films formed using the process of the present invention are useful in such applications as the preparation of printed circuit boards, lithographic printing plates, and cathode ray tubes, as well as in chemical milling, solder resist, and planarizing layer applications. Additional uses for the polymeric films include electrodeposition applications such as in the electrodeposition of undercoat paint for auto bodies and thermal or photocurable electrodeposition coatings for cans.

EXAMPLE 1

Evaluation of Hydrogen Scavengers by Electrolysis of an Aqueous Solution

Compounds were evaluated for their capacity to reduce hydrogen evolution at the cathode during electrolysis. Each compound was added to an electrolyte and the amount of hydrogen gas produced at the cathode was determined. Effective hydrogen scavengers will reduce the amount of hydrogen evolved compared to the electrolysis of the electrolyte without additives.

The electrolyte was a 0.10N HCl aq. solution. The electrodes (1×3.5 cm) were cut from metal foils and were mounted 4 cm apart in a cell, parallel and centered on one other. The cell was filled with 300 g. of electrolyte and a current of 200 mA was applied for 1.5 min. The hydrogen that evolved from the cathode was collected in a graduated cylinder and the volume determined. This was the amount of hydrogen evolved in the absence of the hydrogen scavenger.

To determine the effectiveness of a compound as a hydrogen scavenger, an electrolyte was prepared from 300 g. of 0.10N HCl and 1.5 g of the compound under evaluation. This was subjected to electrolysis in the cell described above to determine the amount of hydrogen evolved in the presence of the compound under evaluation. An effective hydrogen scavenger is one that produces little hydrogen gas relative to the electrolyte without the hydrogen scavenger. A copper cathode and a stainless steel anode was used.

Each evaluation was carried out twice and the results averaged. The results are given in Table 1.

TABLE 1

| COMPOUND | VOLUME HYDROGEN GAS (ml) |
|---|---|
| None | 2.0 |
| 3-Nitro-2-butanol | 0.4 |
| 2-Nitro-1-ethanol | 0.4 |
| Tris(hydroxymethyl)nitromethane | 1.0 |
| 2-Ethyl-2-nitro-1,3-propanediol | 0.7 |
| 2-Methyl-2-nitro-1-propanol | 0.6 |
| Nitromethane | 0.1 |
| Nitroethane | 0.3 |
| 2-nitropropane | 0.4 |
| 4-nitrobenzyl alcohol[1] | 0.8 |
| 2-nitro-1-butanol | 1.9 |
| Maleic acid | 1.3 |
| 1,4-but-2-ynediol[1] | 1.8 |
| Acetonitrile | 1.8 |
| Furfuryl alcohol[1] | 1.0 |
| Hydroquinone | 2.0 |
| Acetone | 1.9 |
| Acrylic acid | 1.5 |
| Itaconic acid | 2.0 |
| Ethyl acrylate | 1.5 |
| Methyl methacrylate | 1.8 |
| 2-bromo-2-nitro-1,3-propanediol | 1.1 |
| 3-nitro-1,2,4-triazole[2] | 0.5 |
| Benzoquinone[1] | 1.2 |
| Acrylamide | 1.4 |
| 2-Propanol | 2.1 |
| Butyl lactate | 2.2 |
| Acetic acid | 2.1 |

[1]The material did not completely dissolve in the electrolyte.
[2]Evaluation was carried out using 150 g of 0.10N HCl and 0.75 g of material. The graduated cylinder used to collect the hydrogen gas was lowered to accomodate the volume change.

The results shown in Table 1 show that some materials substantially reduce the hydrogen evolution at the cathode while others have essentially no effect.

EXAMPLE 2

Effect of Hydrogen Scavenger Concentration

The effect of concentration was determined by measuring the amount of hydrogen produced at various levels of hydrogen scavenger. Nitromethane was used as the hydrogen scavenger and 300 g of 0.10N HCl electrolyte was used in each case. The electrolysis was carried out as described above.

The results are shown in Table 2.

TABLE 2

| WEIGHT OF NITROMETHANE (g) | VOLUME OF HYDROGEN GAS (ml) |
|---|---|
| 0.0 | 2.1 |
| 0.15 | 1.4 |
| 0.30 | 1.1 |
| 0.45 | 0.9 |
| 0.75 | 0.4 |
| 1.05 | 0.3 |
| 1.50 | 0.1 |
| 3.0 | 0.0 |
| 12.0 | 0.0 |
| 30.0 | 0.0 |

These results show the hydrogen scavenger can reduce the amount of hydrogen evolution even at concentrations as low as about 0.05%. The effectiveness increases as the concentration of the hydrogen scavenger increases, until essentially no hydrogen is evolved. Concentrations as high as about 10% can be used.

EXAMPLE 3

Effect of Cathode Material on the Hydrogen Scavenger

Other metals were used as the cathode materials to show the influence of the cathode material on hydrogen evolution. The hydrogen evolution was determined for each cathode material in 0.10N HCl in the absence of a hydrogen scavenger and in then in the presence of the hydrogen scavenger. The hydrogen scavenger in this evaluation was 0.5% by weight of 2-nitroethanol. The evaluation was carried out twice and the results averaged.

The results are tabulated in Table 3.

TABLE 3

| | HYDROGEN EVOLUTION | |
|---|---|---|
| CATHODE MATERIAL | WITHOUT HYDROGEN SCAVENGER | WITH HYDROGEN SCAVENGER |
| Copper | 2.1 | 0.4 |
| Aluminum | 2.2 | 0.2 |
| Graphite | 2.2 | 0.2 |
| Nickel | 2.2 | 0.4 |
| Stainless Steel | 2.2 | 0.4 |
| Zinc | 2.2 | 0.2 |
| Tin | 2.2 | 0.3 |
| Iron | 2.2 | 0.3 |
| Platinum | 2.1 | 0.3 |

The results in Table 3 show that hydrogen evolution is reduced substantially for a wide variety of cathode materials.

EXAMPLE 4

Evaluation of Hydrogen Scavengers During Electrodeposition of a Photocuring Film Compounds were evaluated as hydrogen scavengers by a second method. In this evaluation, the compound was added to an electrodeposition emulsion which, under the conditions selected here, produces a film with defects due to hydrogen gas evolution. This method evaluates the effectiveness of the hydrogen scavenger under more realistic conditions but suffers from a drawback. The hydrogen scavenger can plasticize the emulsion particles in such a way as to produce a thinner film. A thinner film usually has fewer pinholes, even if the compound is ineffective as a hydrogen scavenger. A plasticizer with no capacity as a hydrogen scavenger will produce thinner films with fewer pinholes when added to the emulsion. Therefore, I have found it useful to compare the number of defects at comparable film thickness. The thickness of the film was increased by adjusting the temperature of the deposition.

The emulsion was prepared by mixing 330 g. of a solution polymer (8 parts dimethylaminoethyl methacrylate, 84 parts methyl methacrylate, and 7 parts butyl methacrylate, as a 50% solution in Propasol ® P solvent, a trade mark of the Union Carbide Corporation), 35 g. of pentaerythritol triacrylate (PETA), and a solution of 0.57 g. of Oil Blue N dye in 45 g. of acetone. The mixture was stirred into a homogeneous solution. Then, 14 g. of a 19% lactic acid solution was added and mixed thoroughly. Water (1770 g.) was added slowly with stirring to produce an emulsion. PETA (21 g.) was added to the emulsion and was stirred overnight. The added PETA was completely absorbed by the emulsion particles. The emulsion particle size was 76 nm.

Films were deposited from a sample of the emulsion without added hydrogen scavenger and compared to films deposited from samples of emulsion containing the compound under investigation. The number of pinholes were counted to determine the effectiveness of the compound for reducing defects in the film.

The anode for the electrodeposition was stainless steel with a surface measuring 2.5 × 10 cm. The cathode material was copper clad circuit board material (0.017 cm thick copper foil clad to an epoxy composite base, total thickness 0.079 cm) measuring 2.5 × 10 cm. The copper surface of the cathode was cleaned with a pumice cleaner (Scrub Cleaner 11, Shipley Company) just before use. The emulsion (50 g.) was placed in a 100 ml beaker. The electrodes, placed 2.5 cm apart with the surfaces parallel and centered, were immersed in the emulsion 3 cm. The emulsion temperature was adjusted to 19° C. A potential of 100 V was applied for 12 seconds.

The cathode was removed and rinsed with water and dried with a stream of nitrogen. The film was then crosslinked by exposing it to ultraviolet light (Blakray model XX15 long wave ultraviolet light) for 3 minutes.

The film was evaluated for film defects by counting the defects in selected areas of the film. A mask, the size of the cathode, was prepared for this evaluation. The mask had four holes measuring 2.5 mm. Two of the holes were 1.5 cm from the bottom of the mask and 2 mm in from each edge, and the other two holes were centered along the length of the mask, one 1 cm from the bottom and one 2 cm from the bottom. The mask was placed on the coated cathode and the number of defects in the areas exposed by the holes was counted under a microscope and recorded. The number was sometimes estimated when about 25 or more defects were present. The number of defects will generally be higher near the edges of the film than near the center of the film due to the higher current density at the edges.

Hydrogen scavengers were evaluated by adding 0.25 g. of the material to be evaluated to 50 g. of emulsion, stirring for 1 hour, depositing the film on a cathode, and evaluating as described above. An effective hydrogen scavenger will reduce the number of defects caused by hydrogen evolution.

As stated above, the hydrogen scavenger under evaluation can act as a plasticizer and (in this case) cause thinner films to be deposited with fewer pinholes. The plasticization alone can lead to fewer defects. Therefore, the temperature of the emulsion during deposition was decreased to form a film of about the same thickness as the film deposited at 19° C. without the hydrogen scavenger.

The hydrogen scavenger, the temperature of deposition, and the number of pinholes are recorded in Table 4.

TABLE 4

| HYDROGEN SCAVENGER | TEMP (°C.) | THICKNESS (m) | NUMBER OF PINHOLES | | | |
|---|---|---|---|---|---|---|
| | | | RIGHT | LEFT | TOP | BOTTOM |
| None | 19 | 34 | 19 | 19 | 7 | 8 |
| 3-Nitro-2-butanol | 19 | 29 | 0 | 0 | 0 | 0 |
| 2-Nitro-1-ethanol | 19 | 31 | 0 | 0 | 0 | 0 |
| Tris(hydroxymethyl)nitromethane | 19 | 31 | ~70 | ~75 | ~50 | ~50 |
| 2-Ethyl-2-nitro-1,3-propanediol | 19 | 36 | 10 | 7 | 1 | 1 |
| 2-Methyl-2-nitro-1-propanol | 19 | 35 | 1 | 0 | 0 | 0 |
| Nitromethane | 19 | 26 | 0 | 0 | 0 | 0 |
| Nitromethane | 16 | 43 | 5 | 3 | 3 | 1 |
| Nitroethane | 19 | 24 | 0 | 0 | 0 | 0 |
| Nitroethane | 16 | 39 | 3 | 6 | 0 | 1 |
| 2-nitropropane | 19 | 20 | 0 | 0 | 1 | 0 |
| 2-nitropropane | 16 | 34 | 1 | 4 | 0 | 0 |
| 4-nitrobenzyl alcohol | 19 | 20 | 1 | 0 | 0 | 1 |
| 4-nitrobenzyl alcohol | 16 | 31 | 1 | 0 | 0 | 2 |
| 2-nitro-1-butanol | 19 | 32 | ~60 | ~70 | ~50 | ~50 |
| Maleic acid | 19 | 20 | ~60 | ~60 | ~30 | ~30 |
| Maleic acid | 16 | 35 | 15 | 16 | 11 | 12 |
| 1,4-but-2-ynediol | 19 | 33 | ~40 | ~40 | 15 | 18 |
| Acetonitrile | 19 | 35 | 11 | 16 | 5 | 6 |
| Furfuryl alcohol | 19 | 26 | 9 | 5 | 1 | 5 |
| Hydroquinone | 16 | 56 | 17 | 16 | 11 | 12 |
| Acetone | 19 | 27 | 2 | 0 | 4 | 0 |
| Acetone | 16 | 43 | 15 | 9 | 6 | 6 |
| Acrylic acid | 19 | 8 | ~100 | ~80 | ~80 | ~80 |
| Acrylic acid | 16 | 13 | ~30 | ~30 | 11 | 15 |
| Itaconic acid | 19 | 18 | ~25 | ~25 | ~25 | 20 |
| Itaconic acid | 16 | 40 | ~50 | ~50 | 8 | 9 |
| Ethyl acrylate | 19 | 20 | 0 | 0 | 0 | 0 |
| Ethyl acrylate | 15 | 38 | 10 | 17 | 5 | 3 |
| Methyl methacrylate | 19 | 19 | 0 | 1 | 0 | 0 |
| Methyl methacrylate | 15 | 39 | 5 | 11 | 4 | 12 |
| 2-bromo-2-nitro-1,3-propanediol | 19 | 20 | 4 | 8 | 9 | 6 |
| 2-bromo-2-nitro-1,3-propanediol | 16 | 38 | 18 | 12 | 19 | 9 |
| 3-nitro-1,2,4-triazole | 19 | 38 | ~100 | ~100 | ~100 | ~100 |
| Benzoquinone | 19 | 25 | 2 | 0 | 1 | 0 |
| Benzoquinone | 16 | 35 | 11 | 5 | 3 | 1 |
| Acrylamide | 19 | 40 | 16 | 18 | 6 | 11 |
| 2-Propanol | 19 | 37 | 13 | 15 | 6 | 11 |
| Butyl lactate | 19 | 20 | 1 | 19 | 1 | 2 |
| Butyl lactate | 16 | 38 | 13 | 18 | 7 | 6 |
| Acetic acid | 19 | 6 | ~100 | ~100 | 13 | 26 |
| Acetic acid | 16 | 36 | ~100 | ~100 | ~50 | ~50 |

EXAMPLE 5

Effect of Hydrogen Scavenger Concentration in an Electrodeposition Coating Emulsion The effect of hydrogen scavenger concentration was evaluated by depositing film from an emulsion containing various concentrations of 2-nitroethanol. The depositions were carried out as described in Example 4. The number of defects was determined as described above and the results are tabulated in Table 5.

TABLE 5

| 2-NITRO-ETHANOL CONC (%) | THICK-NESS (m) | RIGHT | LEFT | TOP | BOTTOM |
|---|---|---|---|---|---|
| 0 | 42 | 14 | 13 | 7 | 9 |
| 0.10 | 39 | 14 | 14 | 15 | 11 |
| 0.15 | 40 | 6 | 16 | 2 | 7 |
| 0.20 | 37 | 4 | 10 | 3 | 3 |
| 0.40 | 36 | 1 | 3 | 1 | 1 |
| 1.0 | 20 | 0 | 2 | 0 | 0 |
| 5.0 | 6 | 0 | 0 | 2 | 2 |
| 5.0* | 23 | 1 | 0 | 2 | 2 |

*Deposited at 10° C. to produce at thicker film.

These results show the hydrogen scavenger is effective in concentrations as low a 0.15% and as high as 5% in the coating emulsion.

EXAMPLE 6

Effect of Cathode Material on the Effectiveness of the Hydrogen Scavenger During Film Deposition The effectiveness of the hydrogen scavenger was determined when films were deposited onto a variety of metals. Films were deposited from 50 g. of emulsion, with or without the hydrogen scavenger, onto foils of different metals. The evaluation was carried out as described in Example 4. The results are shown in Table 6.

TABLE 6

| 2-NITRO-ETHANOL CATHODE MATERIAL | (g) | RIGHT | LEFT | TOP | BOTTOM |
|---|---|---|---|---|---|
| Stainless steel | 0 | >100 | >100 | ~80 | ~80 |
| Stainless steel | 0.5 | 17 | 9 | 7 | 11 |
| Iron | 0 | 12 | 23 | 4 | 5 |
| Iron | 0.5 | 0 | 3 | 0 | 1 |
| Zinc | 0 | >100 | >100 | >100 | >100 |
| Zinc | 0.5 | 17 | 28 | 5 | 23 |
| Graphite | 0 | >100 | >100 | >100 | >100 |
| Graphite | 0.5 | >100 | >100 | >100 | >100 |
| Aluminum | 0 | >100 | >100 | >100 | >100 |
| Aluminum | 0.5 | >100 | >100 | >100 | >100 |
| Nickel | 0 | 32 | 30 | 13 | 13 |
| Nickel | 0.25 | 0 | 0 | 0 | 1 |
| Tin | 0 | ~80 | ~80 | ~80 | ~80 |
| Tin | 0.5 | ~60 | ~60 | ~60 | ~60 |
| Platinum | 0 | >100 | >100 | >100 | >100 |

TABLE 6-continued

| 2-NITRO-ETHANOL CATHODE MATERIAL | (g) | RIGHT | LEFT | TOP | BOTTOM |
|---|---|---|---|---|---|
| Platinum | 0.5 | >100 | 17 | ~50 | >100 |

These results in Table 6 show the hydrogen scavenger reduces the defects on a variety of cathode materials. Some of the cathode materials that showed very high defect counts were not substantially improved by the hydrogen scavenger. These defects may have been caused by a mechanism other than hydrogen evolution. Such defects are not eliminated by the hydrogen scavenger.

EXAMPLE 7

Effect of Hydrogen Scavenger on the Electrodeposition of a Noncuring Film From an Emulsion An emulsion was prepared which produced a film that was not a photoresist. The purpose was to demonstrate that the hydrogen evolution can be reduced using emulsions of conventional coatings.

The emulsion was prepared by mixing 16.9 g. of a solution polymer (3.5 parts dimethylaminoethyl methacrylate, 68 parts methyl methacrylate, and 28.5 parts butyl methacrylate, as a 60% solution in Propasol ® P solvent) and a solution of 0.027 g. of Oil Blue N dye in 3.0 g. of acetone. The mixture was stirred into a homogeneous solution. Then, 1.0 g. of a 19% lactic acid solution was added and mixed thoroughly. Water (79 g.) was added slowly, with stirring, to produce an emulsion.

The emulsion was divided into two 50 g. samples and 2-nitroethanol (0.25 g) was added to one of the emulsion samples. Films were deposited onto copper clad circuit board substrates, as described in Example 4, at 29° C. The number of defects were then determined for the film from each emulsion and are shown in Table 7.

TABLE 7

| EMULSION | THICKNESS (m) | RIGHT | LEFT | TOP | BOTTOM |
|---|---|---|---|---|---|
| Without 2-nitropropanol | 23 | 10 | 8 | 4 | 6 |
| With 2-nitropropanol | 23 | 3 | 3 | 0 | 1 |

These results in Table 7 show the hydrogen scavengers are effective for reducing the number of defects in conventional coatings.

I claim:

1. A process for reducing pinhole defects in cataphoretically deposited films comprising electrophoretically depositing on a surface a film formed from a polymer composition comprising an aqueous solution or emulsion of at least one polymer and a compound reduced by hydrogen produced during said deposition.

2. The process of claim 1 wherein said polymer composition further comprises a photoinitiator and an unsaturated crosslinking monomer.

3. The process of claim 1 wherein said compound reduced by hydrogen is selected from the group consisting of; compounds characterized by the formula.

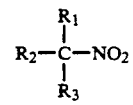

wherein $R_1$ is hydrogen, or a $C_1$-$C_{10}$ alkyl group, $R_2$ is hydrogen, a $C_1$-$C_{10}$ alkyl group, an aromatic hydrocarbon group or hydroxyl substituted $C_1$-$C_{10}$ alkyl group and $R_3$ is hydrogen, a $C_1$-$C_{10}$ alkyl group, an aromatic hydrocarbon group, or a hydroxyl substituted $C_1$-$C_{10}$ alkyl group and when $R_1$ and $R_2$ are both hydrogen, $R_3$ is hydrogen, a $C_1$-$C_{10}$ alkyl group, an aromatic hydrocarbon group, or a hydroxyl substituted $C_1$-$C_{10}$ alkyl group, when $R_1$ is hydrogen and $R_2$ is a $C_1$-$C_{10}$ alkyl group or an aromatic hydrocarbon group, $R_3$ is a $C_1$-$C_{10}$ alkyl group, an aromatic hydrocarbon group, or a hydroxyl substituted $C_2$-$C_{10}$ alkyl group, when $R_1$ is hydrogen and $R_2$ is a hydroxyl substituted $C_1$-$C_{10}$ alkyl group, $R_3$ is a hydroxyl substituted $C_1$-$C_{10}$ alkyl group, when $R_1$ is a $C_1$-$C_{10}$ alkyl group and $R_2$ is a $C_1$-$C_{10}$ alkyl group or a hydroxyl substituted $C_1$-$C_{10}$ alkyl group, $R_3$ is a hydroxyl substituted $C_1$-$C_{10}$ alkyl group; nitrobenzene, nitrobenzene substituted with hydroxyl groups, $C_1$-$C_{10}$ alkyl groups, or hydroxyl substituted $C_1$-$C_{10}$ alkyl groups, furan and furan substituted with hydroxyl groups, $C_1$-$C_{10}$ alkyl groups, or hydroxyl substituted $C_1$-$C_{10}$ alkyl groups.

4. The process of claim 1 wherein said compound reduced by hydrogen is selected from the group consisting of nitromethane, nitroethane, 1-nitropropane, 2-nitropropane, 2-nitroethanol, 2-nitro-1-propanol, 3-nitro-2-butanol, 2-methyl-2-nitro-1-propanol, and 4-nitrobenzyl alcohol.

5. The process of claim 1 wherein said compound reduced by hydrogen is at a concentration of from about 0.05% to 10% by weight based on the total weight of said composition.

6. The process of claim 1 wherein said compound reduced by hydrogen is at a concentration of from about 3% to 5% by weight based on the total weight of said composition.

* * * * *